US009123831B2

(12) United States Patent
Hung et al.

(10) Patent No.: US 9,123,831 B2
(45) Date of Patent: Sep. 1, 2015

(54) SEMICONDUCTOR DEVICE, NITRIDE SEMICONDUCTOR WAFER, AND METHOD FOR FORMING NITRIDE SEMICONDUCTOR LAYER

(71) Applicant: Kabushiki Kaisha Toshiba, Tokyo (JP)

(72) Inventors: Hung Hung, Kanagawa-ken (JP);
Naoharu Sugiyama, Kanagawa-ken (JP); Hisashi Yoshida, Tokyo (JP);
Toshiki Hikosaka, Kanagawa-ken (JP);
Yoshiyuki Harada, Tokyo (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/780,374

(22) Filed: Feb. 28, 2013

(65) Prior Publication Data
US 2014/0077239 A1 Mar. 20, 2014

(30) Foreign Application Priority Data

Sep. 20, 2012 (JP) ................................. 2012-207626

(51) Int. Cl.
*H01L 33/00* (2010.01)
*H01L 21/02* (2006.01)
(Continued)

(52) U.S. Cl.
CPC .......... *H01L 33/002* (2013.01); *H01L 21/0254* (2013.01); *H01L 21/0262* (2013.01);
(Continued)

(58) Field of Classification Search
CPC ................. H01L 21/20–21/208; H01L 12/20;
H01L 29/20; H01L 21/02; H01L 33/002;
H01L 33/12; H01L 33/32; H01L 33/325;
H01L 29/2003; H01L 29/207
USPC .......... 257/94, 98, 190, 197, 415; 438/27, 31, 438/37, 47, 50, 478
See application file for complete search history.

(56) References Cited

U.S. PATENT DOCUMENTS

2002/0195619 A1* 12/2002 Makimoto et al. ............ 257/197
2003/0116774 A1* 6/2003 Yamamoto et al. ............. 257/94
(Continued)

FOREIGN PATENT DOCUMENTS

| JP | 8-264901 A | 10/1996 |
|---|---|---|
| JP | 10-256662 A | 9/1998 |

(Continued)

OTHER PUBLICATIONS

Japanese Office Action issued Jan. 30, 2014 in Patent Application No. 2012-207626 with English Translation.
(Continued)

*Primary Examiner* — Amar Movva
*Assistant Examiner* — Sheikh Maruf
(74) *Attorney, Agent, or Firm* — Oblon, McClelland, Maier & Neustadt, L.L.P.

(57) ABSTRACT

According to one embodiment, a semiconductor device includes a functional layer of a nitride semiconductor. The functional layer is provided on a nitride semiconductor layer including a first stacked multilayer structure provided on a substrate. The first stacked multilayer structure includes a first lower layer, a first intermediate layer, and a first upper layer. The first lower layer contains Si with a first concentration and has a first thickness. The first intermediate layer is provided on the first lower layer to be in contact with the first lower layer, contains Si with a second concentration lower than the first concentration, and has a second thickness thicker than the first thickness. The first upper layer is provided on the first intermediate layer to be in contact with the first intermediate layer, contains Si with a third concentration lower than the second concentration, and has a third thickness.

8 Claims, 9 Drawing Sheets

(51) Int. Cl.
  *H01L 31/0256* (2006.01)
  *H01L 33/12* (2010.01)
  *H01L 33/32* (2010.01)
  *H01L 29/20* (2006.01)
  *H01L 29/207* (2006.01)

(52) U.S. Cl.
  CPC .... *H01L 21/02458* (2013.01); *H01L 21/02505* (2013.01); *H01L 21/02576* (2013.01); *H01L 21/02639* (2013.01); *H01L 21/02647* (2013.01); *H01L 29/2003* (2013.01); *H01L 29/207* (2013.01); *H01L 33/12* (2013.01); *H01L 33/32* (2013.01); *H01L 33/325* (2013.01)

(56) References Cited

U.S. PATENT DOCUMENTS

| | | | |
|---|---|---|---|
| 2005/0285126 A1* | 12/2005 | Wu et al. | 257/94 |
| 2011/0001127 A1* | 1/2011 | Sakamoto et al. | 257/22 |
| 2011/0220190 A1* | 9/2011 | Lee et al. | 136/255 |
| 2012/0205619 A1* | 8/2012 | Gaska et al. | 257/13 |
| 2013/0140525 A1* | 6/2013 | Chen et al. | 257/22 |
| 2013/0277684 A1 | 10/2013 | Araki et al. | |
| 2013/0307001 A1* | 11/2013 | Lee et al. | 257/94 |
| 2014/0166980 A1* | 6/2014 | Goda et al. | 257/13 |

FOREIGN PATENT DOCUMENTS

| | | | |
|---|---|---|---|
| JP | 11-191657 A | | 7/1999 |
| JP | 2000-349338 A | | 12/2000 |
| JP | 2001-192300 A | | 7/2001 |
| JP | 2001192300 A | * | 7/2001 |
| JP | 2003-17420 A | | 1/2003 |
| JP | 2003-277196 A | | 10/2003 |
| JP | 2004-47764 A | | 2/2004 |
| JP | 2004047764 A | * | 2/2004 |
| JP | 2004-179452 A | | 6/2004 |
| JP | 2004179452 A | * | 6/2004 |
| JP | 2007-59719 A | | 3/2007 |
| JP | 2007059719 A | * | 3/2007 |
| JP | 4622466 B2 | | 11/2010 |
| JP | 2011162773 | * | 8/2011 |
| WO | 2012/090818 A1 | | 7/2012 |

OTHER PUBLICATIONS

Office Action issued Apr. 23, 2013 in Japanese Patent Application No. 2012-207626 with English language translation.
Office Action issued Sep. 2, 2013, in Japanese Patent Application No. 2012-207626 with English translation.
U.S. Appl. No. 14/313,014, filed Jun. 24, 2014, Hikosaka, et al.
Japanese Office Action dated Feb. 6, 2015 issued in corresponding JP patent application No. 2014-081768 w/English Translation.
Japanese Office Action dated Feb. 26, 2015 issued in corresponding Japanese patent application No. 2012-207626 (with English translation).
Office Action dated Jun. 3, 2015 issued in corresponding Japanese patent application No. 2014-081768 (with English translation).

* cited by examiner

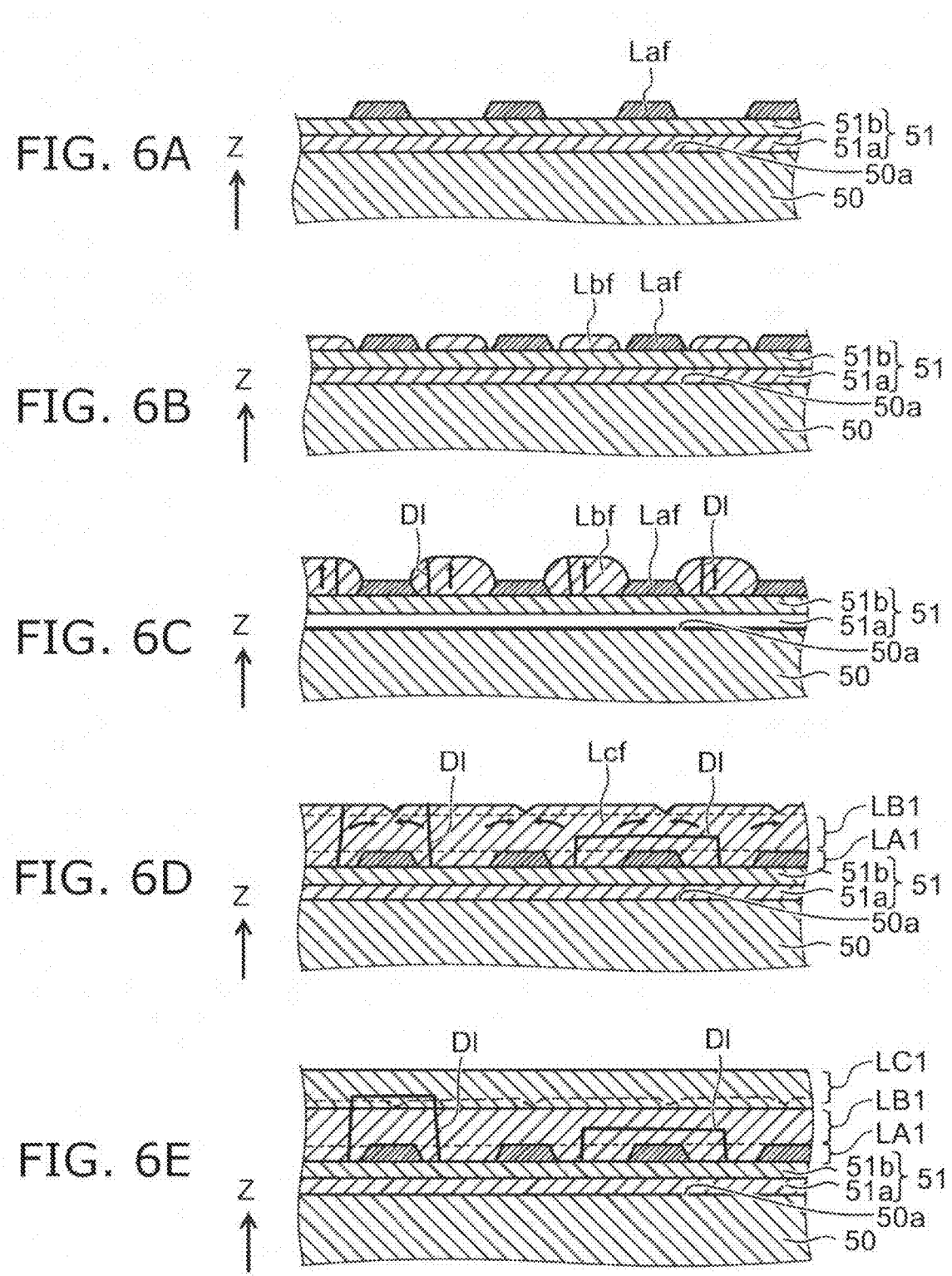

SEMICONDUCTOR DEVICE, NITRIDE SEMICONDUCTOR WAFER, AND METHOD FOR FORMING NITRIDE SEMICONDUCTOR LAYER

CROSS-REFERENCE TO RELATED APPLICATIONS

This application is based upon and claims the benefit of priority from the prior Japanese Patent Application No. 2012-207626, filed on Sep. 20, 2012; the entire contents of which are incorporated herein by reference.

FIELD

Embodiments described herein relate generally to a semiconductor device, a nitride semiconductor wafer, and a method for forming a nitride semiconductor layer.

BACKGROUND

Nitride semiconductors are used in various fields such as optical devices typified by light emitting and light receiving devices and high-speed electronic devices typified by high-frequency devices. A high quality crystal with few dislocations is desired in order to obtain high performance.

BRIEF DESCRIPTION OF THE DRAWINGS

FIG. 6A to FIG. 6E are schematic cross-sectional views showing the method for manufacturing the nitride semiconductor wafer according to the first embodiment;

DETAILED DESCRIPTION

Figure 1:
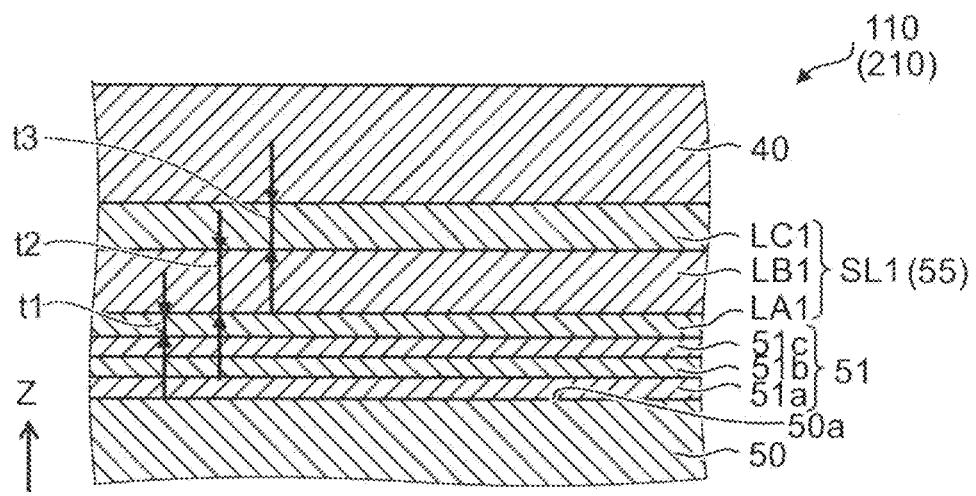
FIG. 1 is a schematic cross-sectional view showing a nitride semiconductor wafer according to a first embodiment.

According to one embodiment, a semiconductor device includes a functional layer of a nitride semiconductor. The functional layer is provided on a nitride semiconductor layer including a first stacked multilayer structure. The first stacked multilayer structure is provided on a major surface of a substrate. The first stacked multilayer structure includes a first lower layer of a nitride semiconductor, a first intermediate layer of a nitride semiconductor, and a first upper layer of a nitride semiconductor. The first lower layer contains Si with a first concentration and has a first thickness.

The first intermediate layer is provided on the first lower layer to be in contact with the first lower layer, contains Si with a second concentration lower than the first concentration, and has a second thickness thicker than the first thickness. The first upper layer is provided on the first intermediate layer to be in contact with the first intermediate layer, contains Si with a third concentration lower than the second concentration, and has a third thickness.

According to one embodiment, a nitride semiconductor wafer is provided. The method includes a substrate having a major surface; and a nitride semiconductor layer. The nitride semiconductor layer includes a first stacked multilayer structure provided on the major surface. The first stacked multilayer structure includes: a first lower layer of a nitride semiconductor containing Si with a first concentration and having a first thickness; a first intermediate layer of a nitride semiconductor provided on the first lower layer to be in contact with the first lower layer, containing Si with a second concentration lower than the first concentration, and having a second thickness thicker than the first thickness; and a first upper layer of a nitride semiconductor provided on the first intermediate layer to be in contact with the first intermediate layer, containing Si with a third concentration lower than the second concentration, and having a third thickness.

According to one embodiment, a method for forming a nitride semiconductor layer is provided. The method includes forming a nitride semiconductor layer including a first stacked multilayer structure on a major surface of a substrate. The first stacked multilayer structure includes: a first lower layer of a nitride semiconductor; a first intermediate layer of a nitride semiconductor; and a first upper layer of a nitride semiconductor, the first lower layer containing Si with a first concentration and having a first thickness, the first intermediate layer being provided on the first lower layer to be in contact with the first lower layer, containing Si with a second concentration lower than the first concentration, and having a second thickness thicker than the first thickness, the first upper layer being provided on the first intermediate layer to be in contact with the first intermediate layer, containing Si with a third concentration lower than the second concentration, and having a third thickness. The growth of the nitride semiconductor layer includes: growing the first lower layer with a first V/III ratio and at a first temperature; growing at least a part of the first intermediate layer on the first lower layer to be in contact with the first lower layer with a second V/III ratio lower than the first V/III ratio and at a second temperature not less than the first temperature; and growing the first upper layer on the first intermediate layer to be in contact with the first intermediate layer with a third V/III ratio lower than the first V/III ratio and higher than the second V/III ratio and at a third temperature higher than the second temperature.

Various embodiments will be described hereinafter with reference to the accompanying drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of the application and the drawings, components similar to those described in regard to a drawing thereinabove are marked with the same reference numerals, and a detailed description is omitted as appropriate.

First Embodiment

A first embodiment relates to a nitride semiconductor wafer. In the nitride semiconductor wafer, for example, at least part of a semiconductor device or a portion that forms at least part of the semiconductor device is provided. The semiconductor device includes, for example, a semiconductor light emitting device, a semiconductor light receiving device, an electronic device, etc. The semiconductor light emitting device includes, for example, a light emitting diode (LED), a laser diode (LD), etc. The semiconductor light receiving device includes, for example, photodiode (PD) etc. The electronic device includes, for example, a high electron mobility field effect transistor (HEMT), a hetero-junction bipolar transistor (HBT), a Schottky barrier diode (SBD), etc.

FIG. 1 is a schematic cross-sectional view illustrating the configuration of a nitride semiconductor wafer according to the first embodiment.

As shown in FIG. 1, a nitride semiconductor wafer 110 according to the embodiment includes a substrate 50 and a nitride semiconductor layer 55. The nitride semiconductor layer 55 includes a first stacked multilayer structure SL1.

The substrate 50 has a major surface 50a. The first stacked multilayer structure SL1 is provided on the major surface 50a.

The first stacked multilayer structure SL1 includes a first lower layer LA1 of a nitride semiconductor, a first intermediate layer LB1 of a nitride semiconductor, and a first upper layer LC1 of a nitride semiconductor.

The first lower layer LA1 contains Si with a first concentration and has a first thickness t1.

The first intermediate layer LB1 is provided on the first lower layer LA1 to be in contact with the first lower layer LA1. The first intermediate layer LB1 contains Si with a second concentration lower than the first concentration and has a second thickness t2 thicker than the first thickness t1.

The first upper layer LC1 is provided on the first intermediate layer LB1 to be in contact with the first intermediate layer LB1. The first upper layer LC1 contains Si with a third concentration lower than the second concentration and has a third thickness t3. The third thickness t3 is, for example, thicker than the first thickness t1. The third thickness t3 is, for example, thicker than the second thickness t2. The third thickness t3 may be, for example, not more than the second thickness t2.

The direction perpendicular to the major surface 50a is taken as the Z-axis direction. The direction from the first lower layer LA1 toward the first upper layer LC1 is the +Z-axis direction.

As described later, the nitride semiconductor layer 55 may include a plurality of stacked multilayer structures. That is, the nitride semiconductor layer 55 may further include, for example, a second stacked multilayer structure etc. in addition to the first stacked multilayer structure SL1. In the following, an example in which one stacked multilayer structure (the first stacked multilayer structure SL1) is provided in the nitride semiconductor layer 55 is described.

A silicon substrate, for example, is used as the substrate 50. A Si(111) substrate, for example, is used as the substrate 50. The embodiment is not limited thereto, and the plane direction of the substrate 50 is arbitrary. Other than this, a substrate of sapphire, GaN, SiC, or the like may be used as the substrate 50.

In this example, the nitride semiconductor wafer 110 further includes a functional layer 40 of a nitride semiconductor. The functional layer 40 is provided on the nitride semiconductor layer 55. The functional layer 40 includes, for example, a layer having the light emitting function of the semiconductor light emitting device. The functional layer 40 includes, for example, a layer having the light receiving function of the semiconductor light receiving device. The functional layer 40 includes, for example, a layer having at least one of the rectification function, the switching function, and the amplification function of the electronic device. Examples of the configuration of the functional layer 40 are described later.

In this example, the nitride semiconductor wafer 110 further includes a buffer layer 51. The buffer layer 51 is provided on the major surface 50a. The buffer layer 51 is provided between the substrate 50 and the nitride semiconductor layer 55 (in this example, the first stacked multilayer structure SL1).

In the specification of the application, the "state where a second layer is provided on a first layer" includes not only the state where the second layer is disposed on the first layer to be in contact with the first layer, but also the state where a third layer is interposed on the first layer and the second layer is disposed on the third layer.

In this example, the buffer layer 51 includes a first buffer layer 51a, a second buffer layer 51b, and a third buffer layer 51c. The second buffer layer 51b is provided on the first buffer layer 51a. The third buffer layer 51c is provided on the second buffer layer 51b.

AlN, for example, is used for the first buffer layer 51a. A low-temperature grown AlN layer, for example, is used as the first buffer layer 51a. The first buffer layer 51a may have a function as a nucleus formation layer provided on the major surface 50a of the substrate 50. The thickness of the first buffer layer 51a is, for example, not less than 10 nanometers (nm) and not more than 200 nm.

$Al_{z2}Ga_{1-z2}N$ ($0<z2<1$), for example, is used for the second buffer layer 51b. AlGaN, for example, is used for the second buffer layer 51b. The thickness of the second buffer layer 51b is, for example, not less than 10 nm and not more than 400 nm.

$Al_{z3}Ga_{1-z3}N$ ($0$ $z3<1$, $z3<z2$), for example, is used for the third buffer layer 51c. GaN, for example, is used for the third buffer layer 51c. The thickness of the third buffer layer 51c is, for example, not less than 10 nm and not more than 300 nm.

Figure 2:
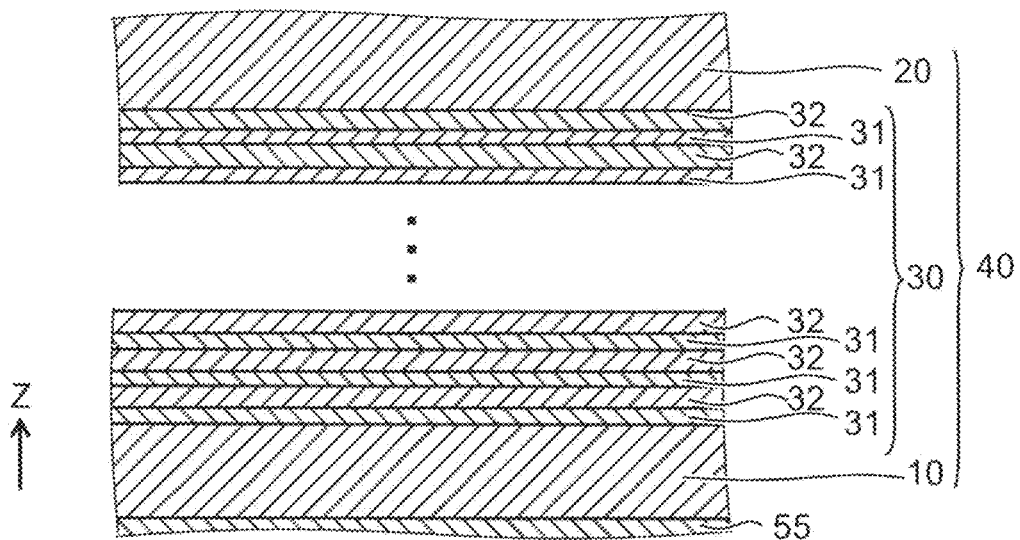
FIG. 2 is a schematic cross-sectional view showing a part of the nitride semiconductor wafer according to the first embodiment.

FIG. 2 is a schematic cross-sectional view illustrating the configuration of part of a nitride semiconductor wafer according to the first embodiment.

FIG. 2 illustrates the configuration of the functional layer 40 in the case where the nitride semiconductor wafer 110 is used for a semiconductor light emitting device.

As shown in FIG. 2, in this example, the functional layer includes an n-type semiconductor layer 10, a p-type semiconductor layer 20, and a light emitting layer 30. The n-type semiconductor layer 10 is provided on the nitride semiconductor layer 55. The n-type semiconductor layer 10 includes a nitride semiconductor. The p-type semiconductor layer 20 is provided on the n-type semiconductor layer 10. The p-type semiconductor layer 20 includes a nitride semiconductor.

The light emitting layer 30 is provided between the n-type semiconductor layer 10 and the p-type semiconductor layer 20. The light emitting layer 30 includes a plurality of barrier layers 31 and a well layer 32 provided between barrier layers 31. The number of well layers 32 may be one or plural. That is, the light emitting layer 30 may have an SQW (single-quantum well) structure or an MQW (multi-quantum well) structure.

The band gap energy of the barrier layer 31 is larger than the band gap energy of the well layer 32. InGaN, for example, is used for the well layer 32. GaN is used for the barrier layer 31. When InGaN is used for the barrier layer 31, the In composition ratio in the barrier layer 31 is smaller than the In composition ratio in the well layer 32. The peak wavelength of the light emitted from the light emitting layer 30 is, for example, not less than 200 nm and not more than 1300 nm.

In this example, the n-type semiconductor layer 10 is provided in the functional layer 40. As described later, there is a case where the nitride semiconductor layer 55 functions as the n-type semiconductor layer, and in this case the n-type semiconductor layer 10 may be omitted.

The nitride semiconductor wafer 110 includes the substrate 50 and the nitride semiconductor layer 55, and the buffer layer 51 and the functional layer 40 may be omitted, for example.

FIG. 1 illustrates also the configuration of a semiconductor device 210 according to the embodiment. The semiconductor device 210 includes the functional layer 40 of a nitride semiconductor. The functional layer 40 is provided on the nitride semiconductor layer 55 including the first stacked multilayer structure SL1.

In the semiconductor device 210, at least part of the nitride semiconductor layer 55 may be removed after the nitride semiconductor layer 55 is formed on the substrate 50. Also the substrate 50 may be removed. Thus, in the semiconductor device 210, at least part of the nitride semiconductor layer 55 may be omitted. The substrate 50 may be omitted.

In the semiconductor device 210, the nitride semiconductor layer 55 includes the first stacked multilayer structure SL1 provided on the major surface 50a of the substrate 50. The first stacked multilayer structure SL1 includes the first lower layer LA1, the first intermediate layer LB1, and the first upper layer LC1 mentioned above. The configurations of these are similar to the configurations of those in the nitride semiconductor wafer 110.

Examples of the configuration of the nitride semiconductor layer 55 in the nitride semiconductor wafer 110 and the semiconductor device 210 will now be described.

Figure 3A:
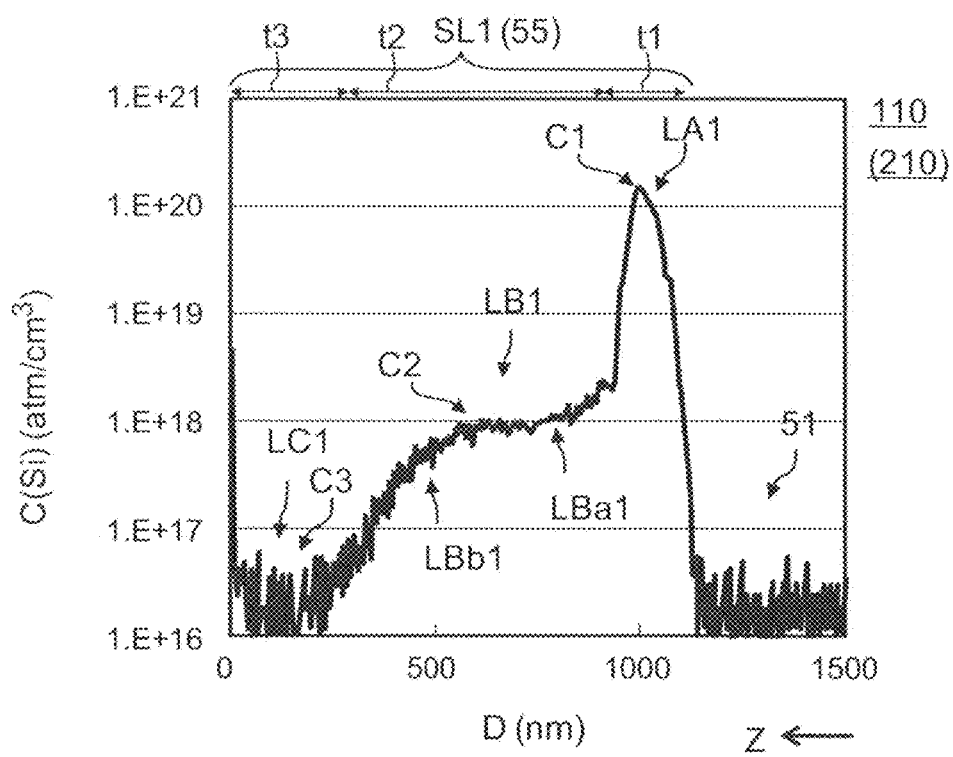
FIG. 3A and FIG. 3B are graphs showing the nitride semiconductor wafer.
Figure 3B:
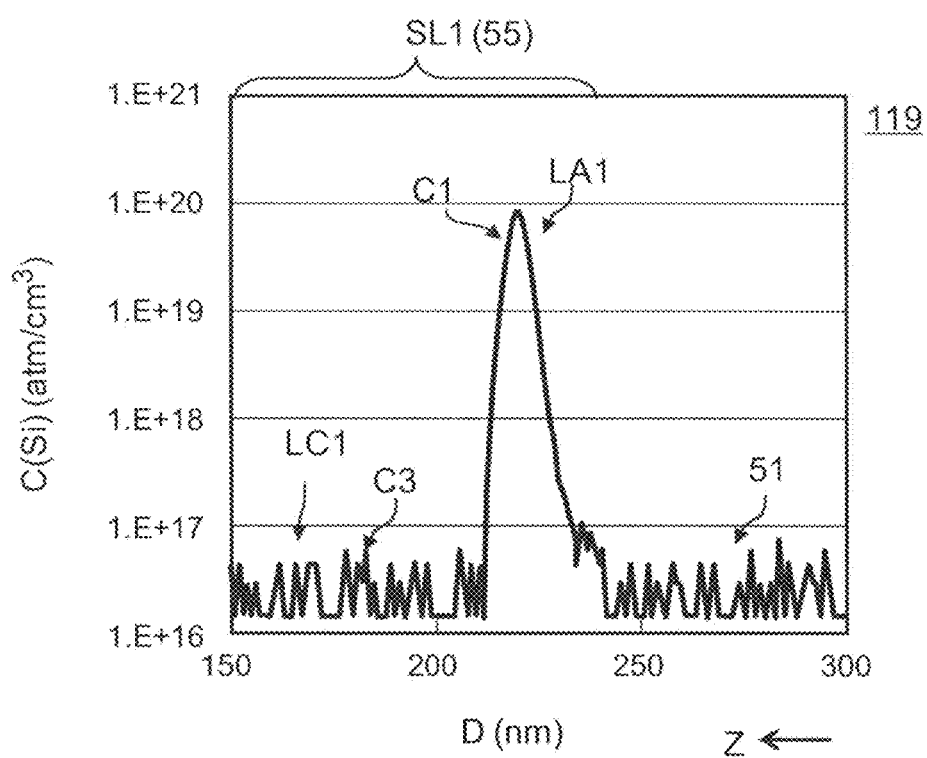

FIG. 3A and FIG. 3B are graphs illustrating the configurations of nitride semiconductor wafers.

The drawings illustrate the measurement results of the profile of the Si concentration in the nitride semiconductor layer 55 (the first stacked multilayer structure SL1). FIG. 3A corresponds to the nitride semiconductor wafer 110 (and the semiconductor device 210) according to the embodiment. FIG. 3B corresponds to a nitride semiconductor wafer 119 of a reference example. In the nitride semiconductor wafer 119 of the reference example, the first lower layer LA1 and the first upper layer LC1 are provided in the first stacked multilayer structure SL1, and the first intermediate layer LB1 is not provided. The horizontal axis of the drawings represents the position in the Z-axis direction (the depth D (nm)). The vertical axis represents the Si concentration C(Si). These examples are examples in which the buffer layer 51 is provided.

As shown in FIG. 3A, in the nitride semiconductor wafer 110 (and the semiconductor device 210) according to the embodiment, the first lower layer LA1 contains Si with a first concentration C1. The first concentration C1 is not less than $1\times10^{19}$ cm$^{-3}$ and not more than $1\times10^{22}$ cm$^{-3}$. In this example, the first concentration C1 is not less than $1\times10^{19}$ cm$^{-3}$ and not more than approximately $2\times10^{20}$ cm$^{-3}$. The maximum value of the Si concentration in the first lower layer LA1, for example, may be taken as the first concentration C1. Also the average value of the Si concentration in the first lower layer LA1, for example, may be taken as the first concentration C1.

The first intermediate layer LB1 contains Si with a second concentration C2. The second concentration C2 is lower than the first concentration C1. In this example, the second concentration C2 is not less than approximately $2\times10^{17}$ cm$^{-3}$ and less than approximately $1\times10^{19}$ cm$^{-3}$.

The first upper layer LC1 has a third concentration C3. The third concentration C3 is lower than the second concentration C2. In this example, the third concentration C3 is not less than $1\times10^{16}$ cm$^{-3}$ and less than $2\times10^{17}$ cm$^{-3}$. The minimum value of the Si concentration in the first upper layer LC1, for example, may be taken as the third concentration C3. The average value of the Si concentration in the first upper layer LC1, for example, may be taken as the third concentration C3.

In this example, the first thickness t1 of the first lower layer LA1 is approximately 200 nm. The second thickness t2 of the first intermediate layer LB1 is approximately 500 nm. The third thickness t3 of the first upper layer LC1 is approximately 300 nm.

Thus, in the embodiment, the first lower layer LA1, the first intermediate layer LB1, and the first upper layer LC1 are provided in the first stacked multilayer structure SL1. The second concentration C2 is lower than the first concentration C1, and the third concentration C3 is lower than the second concentration C2. The second thickness t2 is thicker than the first thickness t1. In the nitride semiconductor wafer 110 (the semiconductor device 210) having such a configuration, an example of the measurement results of the edge dislocation density in the upper surface of the nitride semiconductor layer 55 is $4.3\times10^{8}$ cm$^{-2}$.

On the other hand, as shown in FIG. 3B, the first lower layer LA1 and the first upper layer LC1 are provided in the nitride semiconductor wafer 119 of the reference example. That is, the reference example has a two-layer configuration of a layer with a high Si concentration (the first lower layer LA1) and a layer with a low Si concentration (the first upper layer LC1), and does not include the first intermediate layer LB1 with an intermediate Si concentration. In the nitride semiconductor wafer 119, the first concentration C1 of the first lower layer LA1 is approximately $1\times10^{20}$ cm$^{-3}$. The third concentration C3 of the first upper layer LC1 is approximately not less than $1\times10^{16}$ cm$^{-3}$ and not more than $8\times10^{16}$ cm$^{-3}$. The first thickness t1 of the first lower layer LA1 is approximately 30 nm.

In the nitride semiconductor wafer 119 having such a configuration, the measurement result of the edge dislocation density in the upper surface of the nitride semiconductor layer 55 is $5.3\times10^{9}$ cm$^{-2}$.

On the other hand, in the embodiment, a three-layer configuration of the first lower layer LA1, the first intermediate layer LB1, and the first upper layer LC1 is employed as mentioned above. The edge dislocation density in the embodiment of the three-layer configuration is approximately one tenth of the edge dislocation density in the reference example of the two-layer configuration.

Thus, the embodiment can provide a semiconductor device and a nitride semiconductor wafer with few dislocations.

A method for manufacturing the nitride semiconductor wafer 110 and the semiconductor device 210 like the above according to the embodiment will now be described.

Figure 4:
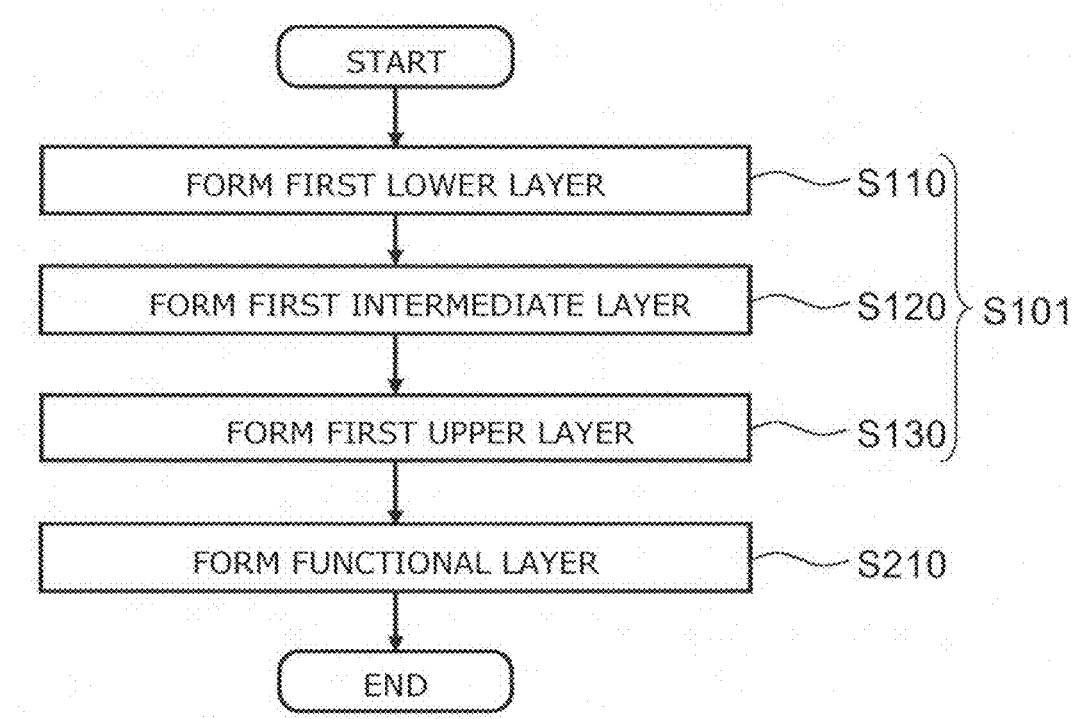
FIG. 4 is a flow chart showing a method for manufacturing the nitride semiconductor wafer according to the first embodiment.

FIG. 4 is a flow chart illustrating a method for manufacturing a nitride semiconductor wafer according to the first embodiment.

The manufacturing method includes forming the nitride semiconductor layer 55 including the first stacked multilayer structure SL1 on the major surface 50a of the substrate 50 (step S101). Forming the functional layer 40 (step S210) may be further provided. The first stacked multilayer structure multilayer structure SL1 includes the first lower layer LA1, the first intermediate layer LB1, and the first upper layer LC1 mentioned above.

As shown in FIG. 4, the formation of the nitride semiconductor layer 55 (step S101) includes growing the first lower layer LA1 (step S110), growing the first intermediate layer LB1 (step S120), and growing the first upper layer LC1 (step S130).

In the formation of the first lower layer LA1, the first lower layer LA1 is formed with a first V/III ratio (R1) and a first temperature (T1).

In the formation of the first intermediate layer LB1, the first intermediate layer LB1 is grown on the first lower layer LA1 to be in contact with the first lower layer LA1. At this time, at least part of the first intermediate layer LB1 is grown with a second V/III ratio (R2) and a second temperature (T2). The second V/III ratio (R2) is lower than the first V/III ratio (R1). The second temperature (T2) is not less than the first temperature (T1).

In the formation of the first upper layer LC1, the first upper layer LC1 is grown on the first intermediate layer LB1 to be in contact with the first intermediate layer LB1. At this time, the first upper layer LC1 is formed with a third V/III ratio (R3) and a third temperature (T3). The third V/III ratio (R3) is lower than the first V/III ratio (R1). The third temperature (T3) is higher than the second temperature (T2).

The V/III ratio is the ratio of the number of atoms of group V elements introduced into the reactor per unit time (N5) to the number of atoms of group III elements introduced into the reactor per unit time (N3) in the formation of the layer (i.e. N5/N3).

In the embodiment, the MOVPE method or the like, for example, is used for the formation of the nitride semiconductor layer 55.

FIG. 5A to FIG. 5F are schematic views illustrating a method for manufacturing a nitride semiconductor wafer according to the first embodiment.

Figure 5A:
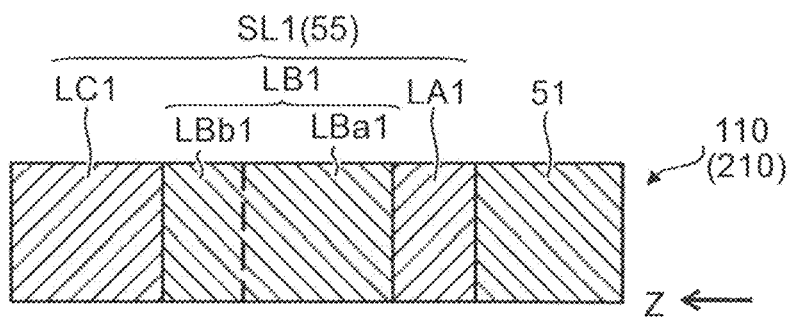
FIG. 5A to FIG. 5F are schematic views showing the method for manufacturing the nitride semiconductor wafer according to the first embodiment.

FIG. 5A is a schematic cross-sectional view illustrating the configuration of the nitride semiconductor wafer 110 (and the semiconductor device 210).

FIG. 5B to FIG. 5F are graphs illustrating the formation conditions of the nitride semiconductor layer 55. The horizontal axis of the drawings shows time t. The time t substantially corresponds to the position (the position in the Z-axis direction) where each layer illustrated in FIG. 5A is formed.

Figure 5B:
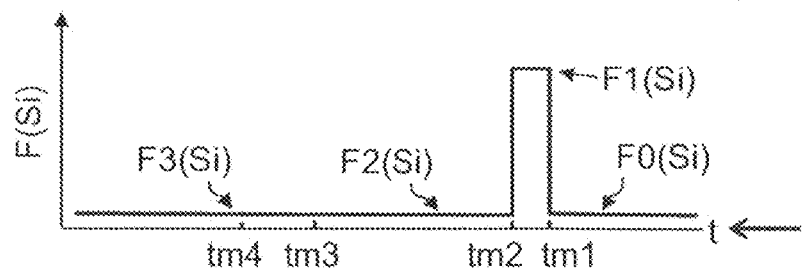

The vertical axis of FIG. 5B shows the normalized value of the flow amount of the Si-containing gas supplied F(Si).

Figure 5C:
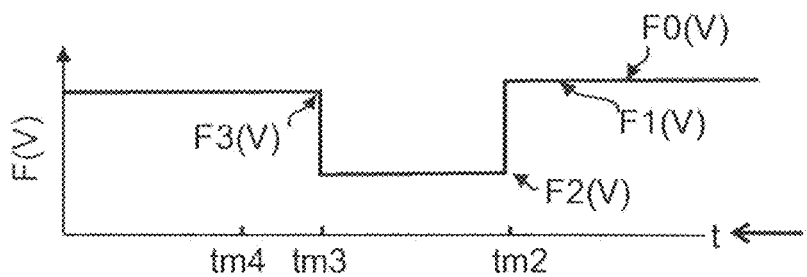

The vertical axis of FIG. 5C shows the normalized value of the flow amount of the gas containing group V elements supplied F(V).

Figure 5D:
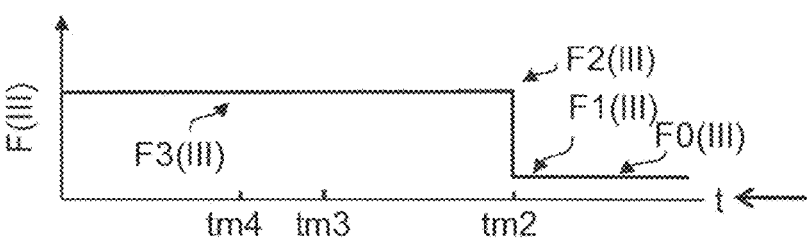

The vertical axis of FIG. 5D shows the normalized value of the flow amount of the gas containing group III elements supplied F(III).

Figure 5E:
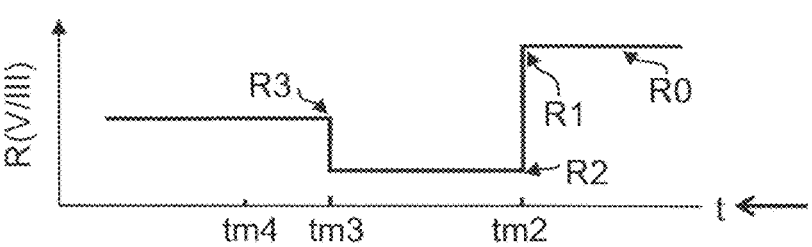

The vertical axis of FIG. 5E shows the V/III ratio R(V/III) in the supplied gas.

Figure 5F:
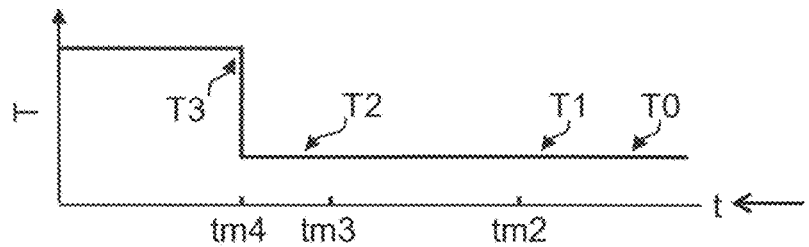

The vertical axis of FIG. 5F shows the film-formation temperature T.

Before a first time tm1, the buffer layer 51 is grown on the major surface 50a of the substrate 50, for example. At this time, for example, a Si-containing gas is not introduced and the flow amount of the Si-containing gas F0(Si) is 0. The flow amount of the gas containing group V elements F0(V) is, for example, $4 \times 10^5$ µmol. The flow amount of the gas containing group III elements F0(III) is, for example, 65 µmol. At this time, the V/III ratio in the supplied gas R0 is 6500. The film-formation temperature T0 is 1000° C.

After that, the first lower layer LA1 is formed on the buffer layer 51. For example, in the time from the first time tm1 to a second time tm2, the flow amount of the Si-containing gas F1(Si) is $9 \times 10^{-2}$ µmol. The flow amount of the gas containing group V elements F1(V) is, for example, $4 \times 10^5$ µmol. The flow amount of the gas containing group III elements F1(III) is, for example, 65 µmol. At this time, the V/III ratio in the supplied gas (the first V/III ratio R1) is 6500. The first temperature T1 is 1000° C. Thereby, for example, at least part of the first lower layer LA1 is formed. In this case, a lower part of the first lower layer LA1 is formed.

At the second time tm2, the flow amount of the Si-containing gas is set smaller than the flow amount F/(Si). At the second time tm2, the flow amount of the gas containing group V elements F2(V) is set to, for example, $2 \times 10^5$ µmol. The flow amount of the gas containing group III elements F2(III) is set to, for example, 130 µmol. At this time, the V/III ratio in the supplied gas (the second V/III ratio R2) is 1500. The temperature remains 1000° C. Thereby, the other part (upper part) of the first lower layer LA1 is formed.

The first intermediate layer LB1 is grown on the first lower layer LA1. For example, in the time after the formation of the first lower layer LA1 mentioned above up to a third time tm3, the flow amount of the Si-containing gas F2(Si) is 0. The flow amount of the gas containing group V elements F2(V) is, for example, $2 \times 10^5$ µmol. The flow amount of the gas containing group III elements F2(III) is, for example, 130 µmol. At this time, the V/III ratio in the supplied gas (the second V/III ratio R2) is 1500. The second temperature T2 is 1000° C. Thus, the second V/III ratio R2 is lower than the first V/III ratio R1. Thereby, for example, at least part of the first intermediate layer LB1 is formed. In this case, a lower part of the first intermediate layer LB1 is formed.

After that, at the third time tm3, the flow amount of the gas containing group V elements F(V) is increased. In the time from the third time tm3 to a fourth time tm4, the flow amount of the Si-containing gas F(Si) remains 0, for example. The flow amount of the gas containing group V elements F(V) is set to, for example, $4 \times 10^5$ µmol (for example, the same as the flow amount F1(V)). The flow amount of the gas containing group III elements F(III) is set to, for example, 130 µmol. At this time, the V/III ratio in the supplied gas is 3000. The film-formation temperature T is 1000° C. (for example, the same as the first temperature T1). Thereby, for example, the other part (upper part) of the first intermediate layer LB1 is formed.

After that, the first upper layer LC1 is formed on the first intermediate layer LB1. For example, after the fourth time tm4, which is a time after the third time tm3, the flow amount of the Si-containing gas F3(Si) is 0. The flow amount of the gas containing group V elements F3(V) is, for example, $4 \times 10^5$ µmol. The flow amount of the gas containing group III elements F3(III) is, for example, 130 µmol. At this time, the V/III ratio in the supplied gas (the third V/III ratio R3) is 3000. The third temperature T3 is 1100° C. Thus, the third V/III ratio R3 is higher than the second V/III ratio R2. In this example, the third V/III ratio R3 is lower than the first V/III ratio R1. The third temperature T3 is higher than the second temperature T2. Thereby, for example, the first upper layer LC1 is formed.

Further, the functional layer 40 is formed as necessary. Thus, the nitride semiconductor wafer 110 (and the semiconductor device 210) according to the embodiment is formed.

FIG. 6A to FIG. 6E are schematic cross-sectional views illustrating a method for manufacturing a nitride semiconductor wafer according to the first embodiment.

The drawings illustrate the configuration of the nitride semiconductor wafer 110 (and the semiconductor device 210) in order of the processes.

As shown in FIG. 6A, for example, a first film Laf is formed in the time from the first time tm1 to the second time tm2. The first film Laf forms at least part of the first lower layer LA1. The first film Laf is formed in an island configuration on the major surface 50a of the substrate 50 (in this example, on the buffer layer 51). The buffer layer 51 is exposed from the portion where the first film Laf is not formed. The first film Laf may have, for example, a configuration of SiN.

As shown in FIG. 6B, for example, a second film Lbf of a nitride semiconductor is formed in the time from the second time tm2 to the third time tm3. The second film Lbf forms at least part of the first lower layer LA1. Part of the second film Lbf may form the first intermediate layer LB1. The second film Lbf is not substantially formed on the first film Laf in the island configuration, for example. Alternatively, the growth rate of the crystal on the first film Laf is slower than the growth rate on the other region (the buffer layer 51). The second film Lbf is selectively formed on the buffer layer 51 exposed from the portion where the first film Laf is not formed.

As shown in FIG. 6C, when the formation of the second film Lbf is further continued the thickness (height) of the second film Lbf increases. At this time, dislocations DI (threading dislocations) are formed in the second film Lbf. The direction in which the dislocation DI extends is mainly along the Z-axis direction. That is, in this stage, the dislocation DI extends in the vertical direction.

In the processing illustrated in FIG. 6B and FIG. 6C, the second film Lbf is grown under conditions where the second film Lbf grows in the vertical direction. Under the conditions where the second film Lbf grows in the vertical direction (a vertical growth mode), the growth rate in the vertical direction (a direction along the Z-axis direction) is greater than the growth rate in the lateral direction (a direction perpendicular to the Z-axis direction). In the vertical growth mode, the second V/III ratio R2 and the second temperature T2 mentioned above are employed. As mentioned above, the second V/III ratio R2 is lower than the first V/III ratio R1. The second temperature T2 is not less than the first temperature T1.

Then, after the fourth time tm4, the V/III ratio in the supplied gas is set higher than the second V/III ratio R2. The film-formation temperature T is set to the third temperature T3, which is higher than the second temperature T2. Thereby, the film formed grows in the lateral direction. Under the conditions where growth is made in the lateral direction (a lateral growth mode), the growth rate in the lateral direction is greater than the growth rate in the vertical direction.

That is, as shown in FIG. 6D, a third film Lcf is formed after the formation of the second film Lbf. The third film Lcf grows so as to cover the first film Laf.

At this time, the third film Lcf grows in the lateral direction, and the direction in which the dislocation DI extends is the lateral direction. The direction in which the dislocation DI extends is bent from the vertical direction to the lateral direction. The direction of dislocations is bent into the lateral direction. Dislocation vanishes once join with dislocation of opposite Burger's vector. Consequently, the number (density) of dislocations DI extending in the vertical direction decreases. Therefore, in the third film Lcf, for example, the dislocation density is smaller than in the second film Lbf. Some dislocations DI may continue to extend in the vertical direction also in the formation of the third film Lcf. In this film-formation, the flatness of the surface of the third film Lcf is higher than the flatness of the second film Lbf.

As shown in FIG. 6E, the first upper layer LC1 is formed after a fifth time tm5. The first upper layer LC1 is, for example, formed so as to grow in the lateral direction. Thereby, dislocations with opposite Burger's vector existing in the first upper layer LC1 are joined to each other. Thereby, the dislocation density is further decreased.

As shown in FIG. 6E, the first film Laf and at least part of the second film Lbf form the first lower layer LA1. The third film Lcf forms at least part of the first intermediate layer LB1. Part of the second film Lbf may be included in the first intermediate layer LB1. In this film-formation, the surface of the first upper film LC1 is made flat.

In the case where the dislocation density is sufficiently reduced in the first intermediate layer LB1 (the third film Lcf), the first upper layer LC1 may be formed by the vertical mode.

Thus, in the embodiment, at least part of the dislocations DI in the first intermediate layer LB1 and at least part of the first upper layer LC1 are, from the lower side to the upper side, bent from the vertical direction (a direction along the direction perpendicular to the major surface 50a) to the lateral direction (a direction along the major surface 50a). Thereby, the dislocation density can be reduced.

Thereby, the dislocation density in the first upper layer LC1 can be decreased than the dislocation density in the first lower layer LA1. The dislocation density can be reduced also in the functional layer 40 formed on the nitride semiconductor layer 55 like this. That is, in the embodiment, the dislocation density in the functional layer 40 is lower than the dislocation density in the first lower layer LA1.

Figure 7:
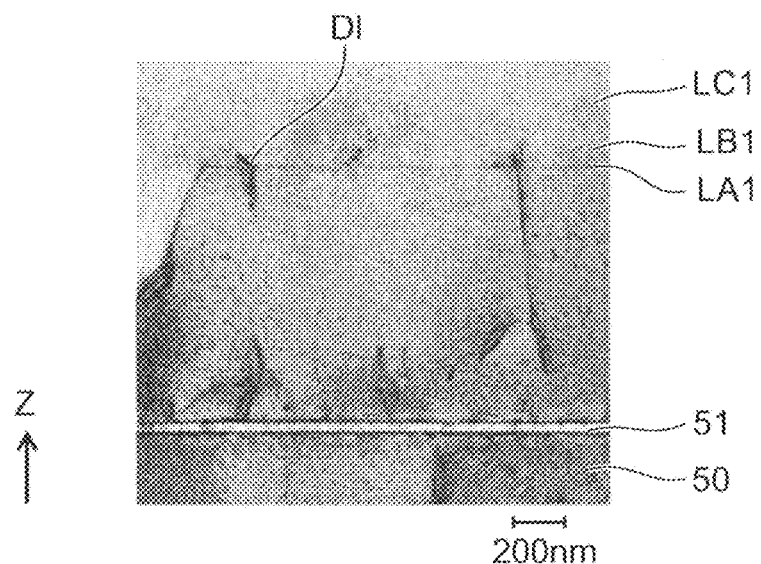
FIG. 7 is a Transmission Electron Microscope photographic image showing the dislocation distribution of nitride semiconductor wafer according to the first embodiment.

FIG. 7 is a microscope photographic image illustrating the configuration of a nitride semiconductor wafer according to the first embodiment.

FIG. 7 illustrates a cross-sectional TEM (transmission electron microscope) image of the nitride semiconductor wafer 110 (and the semiconductor device 210).

As can be seen from FIG. 7, in the first intermediate layer LB1, the dislocation DI is bent from the vertical direction (a direction along the Z-axis direction) to the lateral direction (a direction along the major surface 50a). Thereby, the dislocation density is decreased. A high quality nitride semiconductor layer with few dislocations is obtained in the layer on the upper side of the first intermediate layer LB1.

On the other hand, in the nitride semiconductor wafer 119 of the reference example described in regard to FIG. 3B, for example, the formation of the first intermediate layer LB1 is not performed. Therefore, the growth described in regard to FIG. 6C and FIG. 6D does not occur. Consequently, dislocations DI existing in the first lower layer LA1 are less likely to disappear, and dislocations DI remain. Therefore, the dislocation density is high.

In contrast, in the embodiment, the formation of the first film Laf in the island configuration, the growth of the second film Lbf by the vertical growth mode, and the growth of the third film Lcf by the lateral growth mode are employed. Thereby, the dislocation density can be reduced.

In the embodiment, the first film Laf is formed in the island configuration, and the size of the island and the spacing between islands are set relatively large. Thereby, the growth described in regard to FIG. 6B to FIG. 6D is performed efficiently.

Figures 8A, 8B:
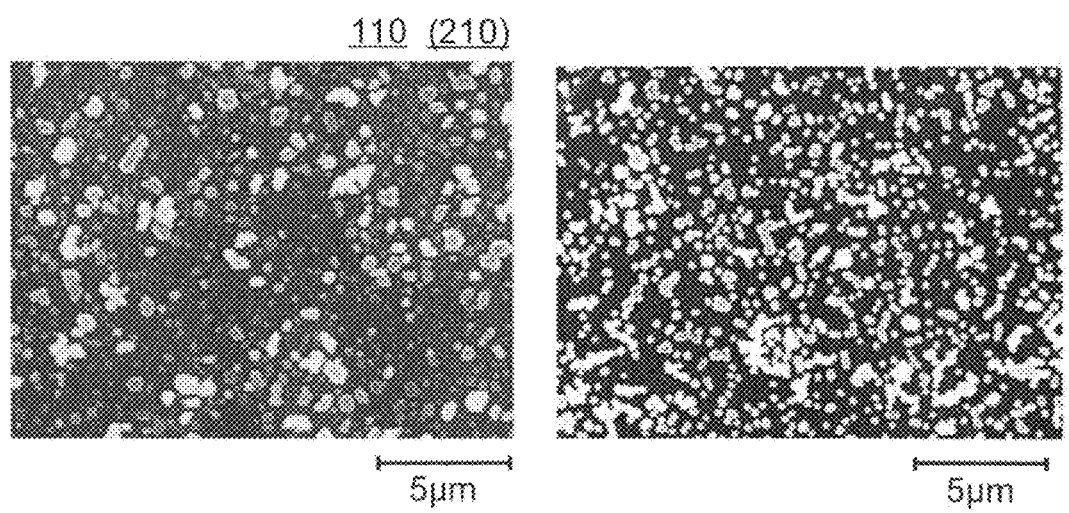
FIG. 8A and FIG. 8B are Scanning Electron Microscope photographic images showing 3D growth of the nitride semiconductor wafer.

FIG. 8A and FIG. 8B are microscope photographic images illustrating the configurations of nitride semiconductor wafers.

The drawings illustrate SEM (scanning electron microscope) images of the surface of the crystal in the course of the formation of the nitride semiconductor layer 55. FIG. 8A corresponds to the nitride semiconductor wafer 110 (and the semiconductor device 210) according to the embodiment. FIG. 8B corresponds to the reference example. In the reference example, the second film Lbf and the third film Lcf are not formed.

FIG. 8A shows the surface of a sample after the formation of the second film Lbf in the embodiment. The grain in the image corresponds to the shape of the first film Laf in the island configuration. The portion other than the grain in the image corresponds to the second film Lbf grown from the surface not covered with the first film Laf. As can be seen from FIG. 8A, in the embodiment, the size of the grain is not less than approximately 0.2 micrometers (μm) and not more than approximately 1 μm.

As can be seen from FIG. 8B, in the reference example, the size of the grain is mostly approximately 0.1 μm and is small. In the reference example, the dislocation density is high.

In the embodiment, the first thickness t1 of the first lower layer LA1 is, for example, not less than 10 nm and not more than 500 nm. The second thickness t2 of the first intermediate layer LB1 is, for example, not less than 200 nm and not more than 800 nm, and is thicker than the first thickness t1. The third thickness t3 of the first upper layer LC1 is, for example, not less than 100 nm and not more than 800 nm, and is thinner than the second thickness t2.

The first thickness t1 is, for example, not less than 10 nm and less than 350 nm. The second thickness t2 is, for example, not less than 350 nm and not more than 800 nm.

The third thickness t3 is, for example, not less than 100 nm and less than 350 nm.

The concentration of Si in the first lower layer LA1 (the first concentration C1) is, for example, not less than $1 \times 10^{19}$ cm$^{-3}$ and less than $1 \times 10^{22}$ cm$^{-3}$. The concentration of Si in the first intermediate layer LB1 (the second concentration C2) is, for example, not less than $2 \times 10^{17}$ cm$^{-3}$ and less than $1 \times 10^{19}$ cm$^{-3}$. The concentration of Si in the first upper layer LC1 (the third concentration C3) is, for example, less than $2 \times 10^{17}$ cm$^{-3}$.

In the embodiment, as described in regard to FIG. 5B, for example, Si is introduced with a high concentration in at least part of the formation of the first lower layer LA1. Si may not be introduced in the formation of the first intermediate layer LB1 (e.g. the formation of the second film Lbf and the third film Lcf), for example. The second temperature T2, which is a high temperature (a relatively high temperature not less than the first temperature T1), is used after the second time tm2 (e.g. in the time from the second time tm2 to the third time tm3), for example. In the processing at the second temperature T2 of a high temperature, the growth mode is changed from the vertical direction to the lateral direction, and Si atoms contained in the first film Laf are taken into the second film Lbf. Si atoms are taken also into the third film Lcf. Thereby, Si is taken into the first intermediate layer LB1 formed of the second film Lbf and the third film Lcf. Thereby, the second concentration C2 is obtained in the first intermediate layer LB1. By performing such processing, the Si concentration varies in the thickness direction in the first intermediate layer LB1.

As shown in FIG. 3A, the first intermediate layer LB1 includes a first lower portion LBa1 and a first upper portion LBb1. The first upper portion LBb1 is provided between the first lower portion LBa1 and the first upper layer LC1. At this time, the concentration of Si in the first lower portion LBa1 is higher than the concentration of Si in the first upper portion LBb1.

Thus, a distribution of the concentration of Si is formed in the first intermediate layer LB1. In such a case, the average of the Si concentration in the first lower portion LBa1 and the Si concentration in the first upper portion LBb1, for example, may be taken as the Si concentration in the first intermediate layer LB1 (the second concentration C2).

The rate of change of the Si concentration to the thickness in the first lower portion LBa1 is lower than the rate of change of the Si concentration to the thickness in the first upper portion LBb1, for example.

In the embodiment, GaN, for example, is used for the first lower layer LA1, the first intermediate layer LB1, and the first upper layer LC1. Also AlGaN may be used for the first lower layer LA1, the first intermediate layer LB1, and the first upper layer LC1.

The first lower layer LA1 may be, for example, $Al_{xa1}In_{ya1}Ga_{1-xa1-ya1}N$ ($0 < xa1 \le 1$, $0 \le ya1 < 1$). The first intermediate layer LB1 may be, for example, $Al_{xb1}In_{yb1}Ga_{1-xb1-yb1}N$ ($0 < xb1 \le 1$, $0\ yb1 < 1$). The first upper layer LC1 may be, for example, $Al_{xc1}In_{yc1}Ga_{1-xc1-yc1}N$ ($0 < xc1 \le 1$, $0 \le yc1 < 1$).

xb1 is the same as xa1, for example. xb1 may be different from xa1. xc1 is the same as xa1, for example. xc1 may be different from xa1. xc1 is the same as xb1, for example. xc1 may be different from xb1.

yb1 is the same as ya1, for example. yb1 may be different from ya1. yc1 is the same as ya1, for example. yc1 may be different from ya1. yc1 is the same as yb1, for example. yc1 may be different from yb1.

In the embodiment, the lattice constant of the first upper layer LC1 may be set larger than the lattice constant of the first intermediate layer LB1. The lattice constant of the first intermediate layer LB1 may be set larger than the lattice constant of the first lower layer LA1. That is, the lattice constant is set to become larger from bottom to top. Compressive stress is applied to the first upper layer LC1. Compressive stress is applied to the first intermediate layer LB1.

In the case where, for example, silicon is used as the substrate 50, due to the difference in the thermal expansion coefficient between the silicon and the nitride semiconductor layer 55, tensile stress may be applied to the nitride semiconductor layer 55 to cause a crack when the temperature is changed from the high temperature in the formation of the nitride semiconductor layer 55 to room temperature.

In such a case, by employing the configuration in which compressive stress is applied to the first upper layer LC1 and compressive stress is applied to the first intermediate layer LB1, compressive stress (compressive strain) is accumulated in the nitride semiconductor layer 55 in the crystal growth. Thereby, for example, a crack due to the difference in the thermal expansion coefficient can be suppressed.

In the embodiment, for example, a low-temperature grown AlN layer that forms the first buffer layer 51a is formed on the major surface 50a of the substrate 50 of silicon. The formation temperature of the first buffer layer 51a is, for example, 900° C. or less. The formation temperature of the first buffer layer 51a is, for example, approximately 700° C. The thickness of the first buffer layer 51a is, for example, 30 nm. The second buffer layer 51b (e.g. an AlGaN layer) is formed on the first buffer layer 51a as necessary. The third buffer layer 51c (e.g. a GaN layer) is formed on the second buffer layer 51b as necessary. Thereby, the buffer layer 51 is formed. The nitride semiconductor layer 55 mentioned above is formed on the buffer layer 51 like this.

In the embodiment, an n-type GaN layer that forms the n-type semiconductor layer 10, for example, is formed on the nitride semiconductor layer 55. The formation temperature of the n-type semiconductor layer 10 is, for example, 1100° C. The n-type semiconductor layer 10 is doped with, for example, Si. The thickness of the n-type semiconductor layer 10 is, for example, 2 μm.

The light emitting layer 30 is formed on the n-type semiconductor layer 10. In the formation of the light emitting layer 30, for example, an $In_{0.15}Ga_{0.85}N$ layer that forms the well layer 32 and a GaN layer that forms the barrier layer 31 are stacked at a temperature of, for example, not less than 700° C. and not more than 900° C.

A p-type GaN layer that forms the p-type semiconductor layer 20 is formed on the light emitting layer 30. The p-type semiconductor layer 20 is doped with Mg. The formation temperature of the p-type semiconductor layer 20 is, for example, 950° C.

Thereby, the nitride semiconductor wafer 110 according to the embodiment is formed. Further, after that, a p-side electrode and an n-side electrode are formed and then the workpiece is divided into individual devices; thus, the semiconductor device 210 (a semiconductor light emitting device) is formed.

Second Embodiment

Figure 9:
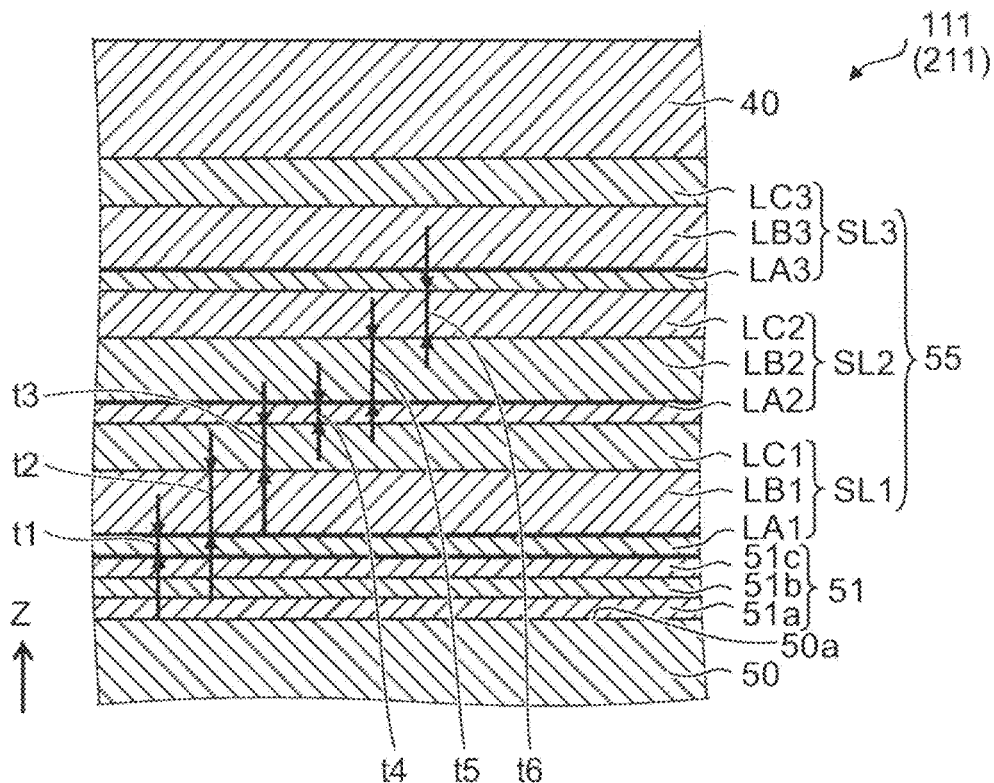
FIG. 9 is a schematic cross-sectional view showing a nitride semiconductor wafer according to a second embodiment.

FIG. 9 is a schematic cross-sectional view illustrating the configuration of a nitride semiconductor wafer according to a second embodiment.

FIG. 9 illustrates also the configuration of a semiconductor device 211 according to the embodiment.

As shown in FIG. 9, also in a nitride semiconductor wafer 111 (and the semiconductor device 211) according to the embodiment, the substrate 50 and the nitride semiconductor layer 55 are provided. In the embodiment, the nitride semiconductor layer 55 further includes a second stacked multilayer structure SL2 in addition to the first stacked multilayer structure SL1. Thus, a plurality of stacked multilayer structures are provided in the nitride semiconductor layer 55. Other than this, the configuration is similar to that of the first embodiment and a description is therefore omitted.

In this example, the nitride semiconductor layer 55 further includes a third stacked multilayer structure SL3. The number of stacked structures provided in the nitride semiconductor layer 55 is, for example, not less than 2 and not more than 10. However, the number is arbitrary.

The second stacked multilayer structure SL2 includes a second lower layer LA2 of a nitride semiconductor, a second intermediate layer LB2 of a nitride semiconductor, and a second upper layer LC2 of a nitride semiconductor.

The second lower layer LA2 is provided on the first upper layer LC1. The second lower layer LA2 contains Si with a fourth concentration and has a fourth thickness t4.

The second intermediate layer LB2 is provided on the second lower layer LA2 to be in contact with the second lower layer LA2. The second intermediate layer LB2 contains Si with a fifth concentration and has a fifth thickness t5. The fifth concentration is lower than the fourth concentration. The fifth thickness t5 is thicker than the fourth thickness t4.

The second upper layer LC2 is provided on the second intermediate layer LB2 to be in contact with the second intermediate layer LB2. The second upper layer LC2 contains Si with a sixth concentration and has a sixth thickness t6. The sixth concentration is lower than the fifth concentration. The sixth thickness t6 is, for example, thicker than the fourth thickness t4. The sixth thickness t6 is, for example, thicker than the fifth thickness t5. The sixth thickness t6 may be, for example, not more than the fifth thickness t5.

The third stacked multilayer structure SL3 includes a third lower layer LA3 of a nitride semiconductor, a third intermediate layer LB3 of a nitride semiconductor, and a third upper layer LC3 of a nitride semiconductor.

The third lower layer LA3 is provided on the second upper layer LC2. The third lower layer LA3 contains Si with a seventh concentration and has a seventh thickness.

The third intermediate layer LB3 is provided on the third lower layer LA3 to be in contact with the third lower layer LA3. The third intermediate layer LB3 contains Si with an eighth concentration and has an eighth thickness. The eighth concentration is lower than the seventh concentration. The eighth thickness is thicker than the seventh thickness.

The third upper layer LC3 is provided on the third intermediate layer LB3 to be in contact with the third intermediate layer LB3. The third upper layer LC3 contains Si with a ninth concentration and has a ninth thickness. The ninth concentration is lower than the eighth concentration. The ninth thickness is, for example, thicker than the seventh thickness. The ninth thickness is, for example, thicker than the eighth thickness. The ninth thickness may be, for example, not more than the eighth thickness.

The configurations of the second lower layer LA2, the second intermediate layer LB2, and the second upper layer LC2 may be, for example, the same as the configurations of the first lower layer LA1, the first intermediate layer LB1, and the first upper layer LC1, respectively, or may be different from them. The same configuration may be employed from the viewpoint of the simplicity of manufacturing processes.

The configurations of the third lower layer LA3, the third intermediate layer LB3, and the third upper layer LC3 may be, for example, the same as the configurations of the first lower layer LA1, the first intermediate layer LB1, and the first upper layer LC1, respectively, or may be different from them. The same configuration may be employed from the viewpoint of the simplicity of manufacturing processes.

In the embodiment, the manufacturing conditions of the first stacked multilayer structure SL1 and modifications thereof may be applied to the manufacturing conditions of the second stacked multilayer structure SL2 and the third stacked multilayer structure SL3. Also in the embodiment, the dislocation density can be reduced. By providing a plurality of stacked structures, the dislocation density can be further reduced than in the case where one stacked multilayer structure is provided.

In the embodiment, by providing a plurality of stacked structures, at least part of the nitride semiconductor layer 55 can function as an n-type semiconductor. Therefore, in the embodiment, in the case where the functional layer 40 is provided on the nitride semiconductor layer 55, the n-type semiconductor layer provided in the functional layer 40 can be omitted.

Figure 10:
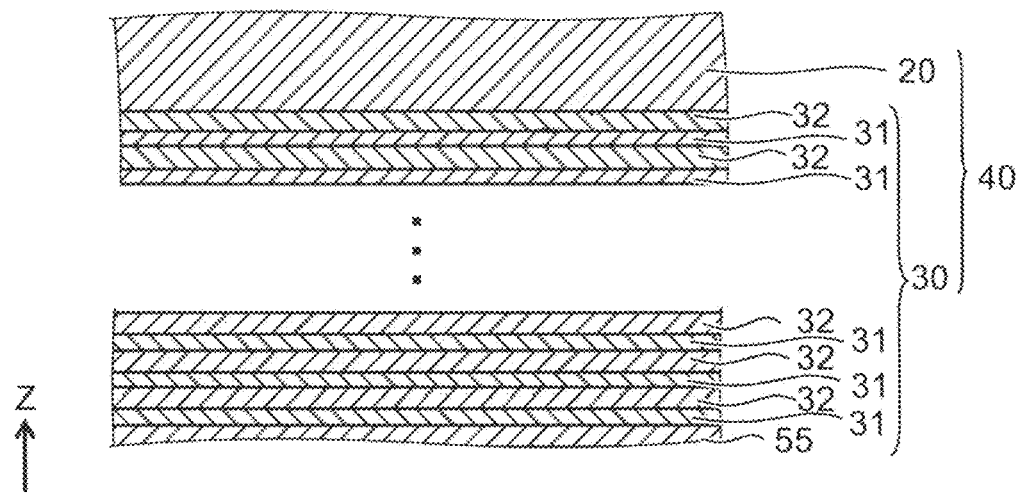
FIG. 10 is a schematic cross-sectional view showing a part of the nitride semiconductor wafer according to the second embodiment.

FIG. 10 is a schematic cross-sectional view illustrating the configuration of a nitride semiconductor wafer according to the second embodiment.

FIG. 10 illustrates also the configuration of the semiconductor device 211 according to the embodiment.

As shown in FIG. 10, in the nitride semiconductor wafer 111 (and the semiconductor device 211) according to the embodiment, the functional layer 40 provided includes the light emitting layer 30 of a nitride semiconductor and the p-type semiconductor layer 20 of a nitride semiconductor. In this example, the light emitting layer 30 is in contact with the nitride semiconductor layer 55.

The light emitting layer 30 is provided on the nitride semiconductor layer 55 mentioned above. The p-type semiconductor layer 20 is provided on the light emitting layer 30. The nitride semiconductor layer 55 containing Si is used as the n-type semiconductor layer. By this configuration, some processes can be omitted.

Third Embodiment

A third embodiment relates to a semiconductor device.

A semiconductor device according to the embodiment includes, for example, a semiconductor light emitting device, a semiconductor light receiving device, an electronic device, etc. The semiconductor device according to the embodiment is manufactured on the basis of the wafer according to the first embodiment and the second embodiment.

The semiconductor device according to the third embodiment includes, for example, the semiconductor device 210 described in regard to the first embodiment and the semiconductor device 211 described in regard to the second embodiment. In the following, other examples are described for the embodiment.

Figure 11:
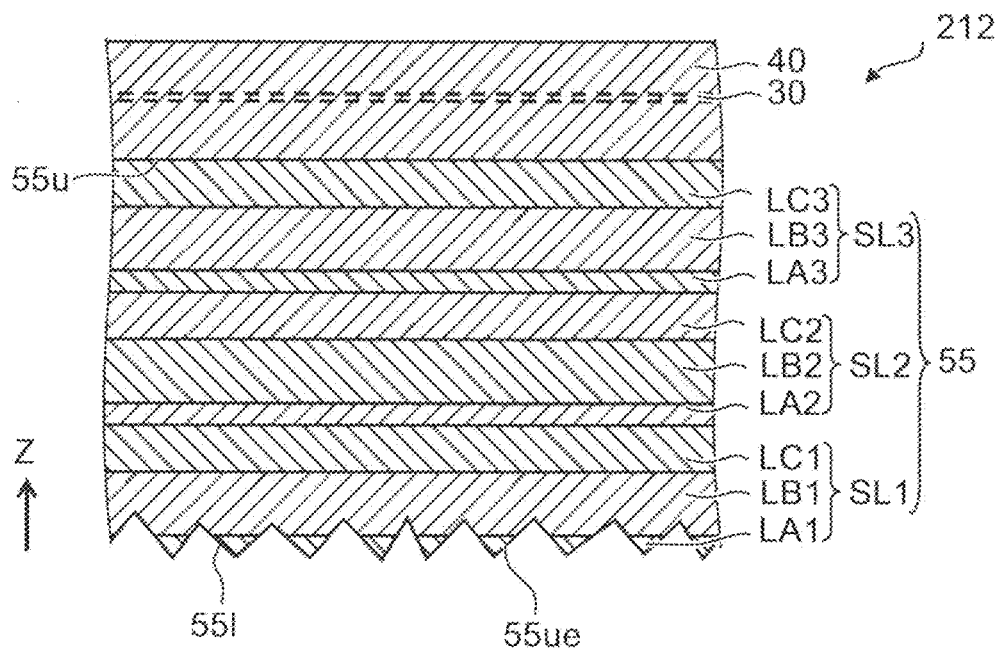
FIG. 11 is a schematic cross-sectional view showing a semiconductor device according to a third embodiment.

FIG. 11 is a schematic cross-sectional view illustrating the configuration of a semiconductor device according to the third embodiment.

As shown in FIG. 11, a semiconductor device 212 according to the embodiment includes the nitride semiconductor layer 55 according to the embodiments mentioned above and the functional layer 40. The functional layer 40 is formed on the nitride semiconductor layer 55. That is, in this example, the substrate 50 (and the buffer layer 51) is removed after the nitride semiconductor layer 55 and the functional layer 40 are formed.

In this example, a plurality of stacked structures (the first stacked multilayer structure SL1, the second stacked multilayer structure SL2, the third stacked multilayer structure SL3, etc.) are provided in the nitride semiconductor layer 55. The surface of the nitride semiconductor layer 55 is provided with unevenness 55ue. The nitride semiconductor layer 55 has an upper surface 55u opposed to the functional layer 40 and a lower surface 55l on the opposite side to the upper surface. The unevenness 55ue is provided on the lower surface 55l.

The depth of the unevenness 55ue is, for example, ½ or more of the wavelength of the light emitted from the light emitting layer 30 provided in the functional layer 40. The depth of the unevenness 55ue is, for example, 200 nm or more. The depth of the unevenness 55ue is 5 times or less of the wavelength of the light emitted from the light emitting layer 30. The depth of the unevenness 55ue is, for example, 2 µm or less.

By providing the unevenness 55ue, the travel direction of the light emitted from the light emitting layer 30 can be changed. Thereby, light extraction efficiency is improved.

Figure 12:
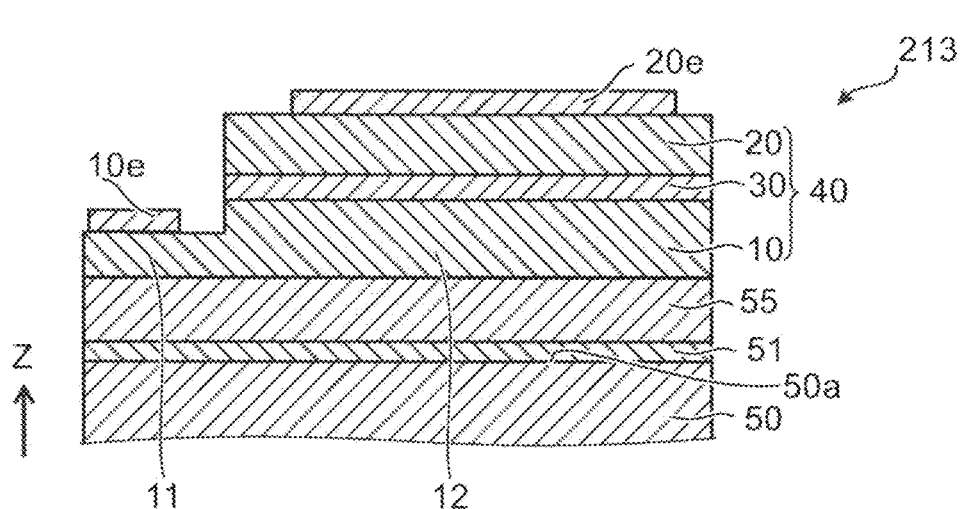
FIG. 12 is a schematic cross-sectional view showing a semiconductor device according to the third embodiment.

FIG. 12 is a schematic cross-sectional view illustrating the configuration of a semiconductor device according to the third embodiment.

As shown in FIG. 12, in a semiconductor device 213 according to the embodiment, the n-type semiconductor layer 10 has a first portion 11 and a second portion 12. The second portion 12 is aligned with the first portion 11 along a direction perpendicular to the Z-axis direction. The light emitting layer is provided on the second portion 12. The p-type semiconductor layer 20 is provided on the light emitting layer 30.

A first electrode 10e electrically connected to the first portion 11 is provided on the first portion 11. A second electrode 20e electrically connected to the p-type semiconductor layer 20 is provided on the p-type semiconductor layer 20 on the second portion 12. A current is supplied to the light emitting layer 30 via the first electrode 10e and the second electrode 20e, and light is emitted from the light emitting layer 30.

Figure 13:
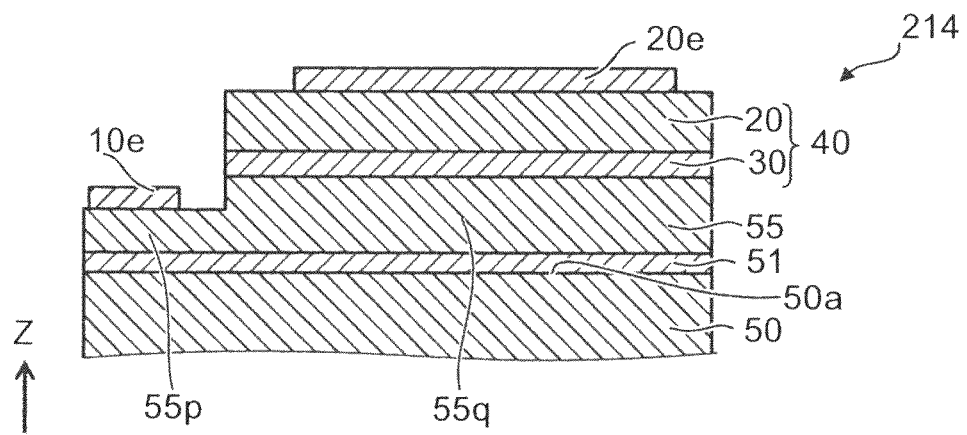
FIG. 13 is a schematic cross-sectional view showing a semiconductor device according to the third embodiment.

FIG. 13 is a schematic cross-sectional view illustrating the configuration of a semiconductor device according to the third embodiment.

As shown in FIG. 13, in a semiconductor device 214 according to the embodiment, the n-type semiconductor layer is omitted in the functional layer 40. The nitride semiconductor layer 55 functions as the n-type semiconductor layer.

The nitride semiconductor layer 55 has a first portion 55p and a second portion 55q. The second portion 55q is aligned with the first portion 55p along a direction perpendicular to the Z-axis direction. The light emitting layer 30 is provided on the second portion 55p. The p-type semiconductor layer 20 is provided on the light emitting layer 30. In this example, the light emitting layer 30 is in contact with the nitride semiconductor layer 55 (the second portion 55q).

The first electrode 10e electrically connected to the first portion 55p is provided on the first portion 55p. The second electrode 20e electrically connected to the p-type semiconductor layer 20 is provided on the p-type semiconductor layer 20 on the second portion 55q.

In the semiconductor devices 212, 213, and 214 according to the embodiment, the nitride semiconductor layer 55 has few dislocations, and consequently also the functional layer 40 has few dislocations. Thereby, for example, highly efficient characteristics (e.g. light emission efficiency) are obtained.

Figure 14:
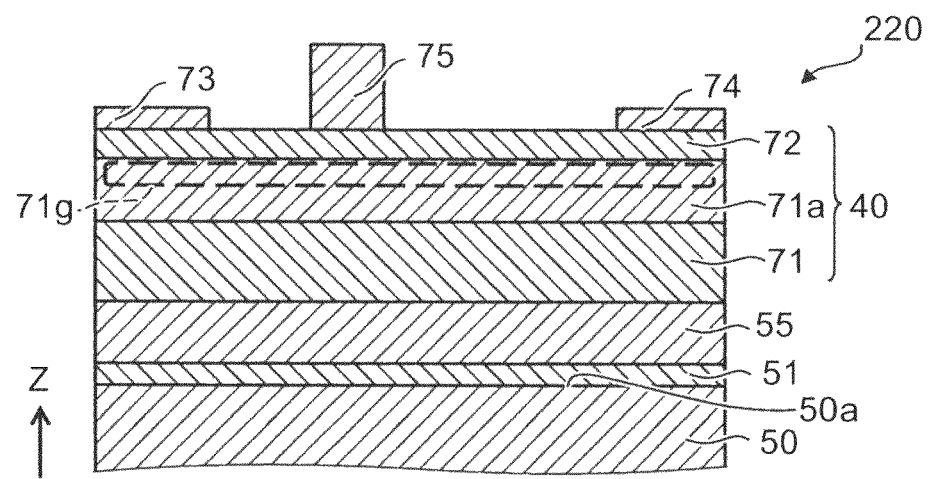
FIG. 14 is a schematic cross-sectional view showing a semiconductor device according to the third embodiment.

FIG. 14 is a schematic cross-sectional view illustrating the configuration of a semiconductor device according to the third embodiment.

As shown in FIG. 14, in a semiconductor device 220 according to the embodiment, an n-type semiconductor layer 71, an undoped semiconductor layer 71a, and an upper semiconductor layer 72 are provided as the functional layer 40. The semiconductor device 220 further includes a source electrode 73, a drain electrode 74, and a gate electrode 75.

The n-type semiconductor layer 71 is provided on the nitride semiconductor layer 55. The undoped semiconductor layer 71a is provided on the n-type semiconductor layer 71. The upper semiconductor layer 72 is provided on the undoped semiconductor layer 71a. The bad gap energy of the upper semiconductor layer 72 is larger than the band gap energy of the n-type semiconductor layer 71.

The undoped semiconductor layer 71a forms a channel layer. The upper semiconductor layer 72 forms a barrier layer. The upper semiconductor layer 72 is joined to the undoped semiconductor layer 71a by hetero-junction, for example.

The n-type semiconductor layer 71 contains, for example, undoped $Al_\alpha Ga_{1-\alpha}N$ ($0 \leq \alpha \leq 1$). The undoped semiconductor layer 71a contains, for example, $Al_0 Ga_{1-\alpha}N$ ($0 \leq \alpha \leq 1$) having the same Al composition ratio as the n-type semiconductor layer 71. The upper semiconductor layer 72 contains, for example, undoped or n-type $Al_\beta Ga_{1-\beta}N$ ($0 \leq \beta 1$, $\alpha < \beta$). For example, an undoped GaN layer is used as the n-type semiconductor layer 71. An undoped or n-type AlGaN layer is used as the upper semiconductor layer 72.

The source electrode 73, the drain electrode 74, and the gate electrode 75 are provided on the upper semiconductor layer 72. The drain electrode 74 is away from the source electrode 73. The source electrode 73 and the drain electrode 74 are in ohmic contact with the surface of the upper semiconductor layer 72. The gate electrode 75 is provided between the source electrode 73 and the drain electrode 74. The gate electrode 75 is in Shottky contact with the surface of the upper semiconductor layer 72.

The lattice constant of the upper semiconductor layer 72 is smaller than the lattice constant of the undoped semiconductor layer 71a. Thereby, strain is produced in the upper semiconductor layer 72. Piezoelectric polarization occurs in the upper semiconductor layer 72 due to the piezoelectric effect. Consequently, a two-dimensional electron gas 71g is formed near the interface with the upper semiconductor layer 72 of the undoped semiconductor layer 71a.

In the semiconductor device 220, by controlling the gate voltage applied to the gate electrode 75, the concentration of the two-dimensional electron gas 71g under the gate electrode 75 is changed and the current flowing between the source electrode 73 and the drain electrode 74 is controlled. The semiconductor device 220 is, for example, a HEMT (high electron mobility transistor).

In the semiconductor device 220, the nitride semiconductor layer 55 has few dislocations, and consequently also the functional layer 40 has few dislocations. Thereby, performance is stabilized and reliability can be improved.

Fourth Embodiment

The embodiment relates to a method for forming a nitride semiconductor layer.

In the manufacturing method, for example, the processing described in regard to FIG. 4, FIG. 5A to FIG. 5F, and FIG. 6A to FIG. 6E is performed.

The manufacturing method includes forming the nitride semiconductor layer 55 including the first stacked multilayer structure SL1 on the major surface 50a of the substrate 50 (step S101).

The first stacked multilayer structure SL1 includes the first lower layer LA1 mentioned above, the first intermediate layer LB1 mentioned above, and the first upper layer LC1 mentioned above.

The formation of the nitride semiconductor layer 55 (step S101) includes forming the first lower layer LA1 (step S110), forming the first intermediate layer LB1 (step S120), and forming the first upper layer LC1 (step S130).

In step S110, the first lower layer LA1 is formed with the first V/III ratio R1 and the first temperature T1.

In step S120, at least part of the first intermediate layer LB1 is formed on the first lower layer LA1 to be in contact with the first lower layer LA1 with the second V/III ratio R2 and the second temperature T2. The second V/III ratio R2 is lower than the first V/III ratio R1.

In step S130, the first upper layer LC1 is formed on the first intermediate layer LB1 to be in contact with the first intermediate layer LB1 with the third V/III ratio R3 and the third temperature T3. The third V/III ratio R3 is lower than the first V/III ratio R1 and higher than the second V/III ratio R2. The third temperature T3 is higher than the second temperature T2.

Thereby, the dislocation density can be reduced in the nitride semiconductor layer 55.

In the embodiment, the formation of the first lower layer LA1 includes forming the first film Laf containing Si that forms the first lower layer LA1 in a discontinuous island configuration on the buffer layer 51 formed on the major surface 50a.

The formation of the first intermediate layer LB1 includes the formation of the second film Lbf of a nitride semiconductor and the formation of the third film Lcf of a nitride semiconductor. In the formation of the second film Lbf, the second film Lbf is formed on the buffer layer 51 not covered with the first film in the discontinuous island configuration mentioned above. In the formation of the third film Lcf, the third film Lcf containing a nitride semiconductor is grown on the second film Lbf in a direction parallel to the major surface 50a to cover the first film Laf with the third film Lcf.

In the manufacturing method, the dislocation density in the first upper layer LC1 is lower than the dislocation density in the first lower layer LA1.

In the manufacturing method, the formation of the first intermediate layer LB1 includes bending at least part of the dislocations included in the first intermediate layer LB1 from a direction along the direction perpendicular to the major surface 50a to a direction along the major surface 50a, from the lower side to the upper side.

The formation of the first upper layer LC1 may include bending at least part of the dislocations within the first upper layer LC1. The directions of dislocations are between the direction perpendicular to the major surface 50a and the major surface 50a, from the lower side to the upper side.

In the manufacturing method, the nitride semiconductor layer 55 may further include the second stacked multilayer structure SL2 provided on the first stacked multilayer structure SL1.

The second stacked multilayer structure SL2 includes the second lower layer LA2 of a nitride semiconductor, the second intermediate layer LB2 of a nitride semiconductor, and the second upper layer LC2 of a nitride semiconductor. The second lower layer LA2 is provided on the first upper layer LC1. The second lower layer LA2 contains Si with the fourth concentration and has the fourth thickness t4. The second intermediate layer LB2 is provided on the second lower layer LA2 to be in contact with the second lower layer LA2. The second intermediate layer LB2 contains Si with the fifth concentration lower than the fourth concentration and has the fifth thickness t5 thicker than the fourth thickness t4. The second upper layer LC2 is provided on the second intermediate layer LB2 to be in contact with the second intermediate layer LB2. The second upper layer LC2 contains Si with the sixth concentration lower than the fifth concentration and has the sixth thickness t6.

At this time, the formation of the nitride semiconductor layer 55 further includes the formation of the second lower layer LA2, the formation of the second intermediate layer LB2, and the formation of the second upper layer LC2.

In the formation of the second lower layer LA2, the second lower layer LA2 is formed with a fourth V/III ratio and a fourth temperature.

The formation of the second intermediate layer LB2 includes forming at least part of the second intermediate layer LB2 on the second lower layer LA2 to be in contact with the second lower layer LA2 with a fifth V/III ratio lower than the fourth V/III ratio and a fifth temperature not less than the fourth temperature.

The formation of the second upper layer LC2 includes forming the second upper layer LC2 on the second intermediate layer LB2 to be in contact with the second intermediate layer LB2 with a sixth V/III ratio lower than the fourth V/III ratio and higher than the fifth V/III ratio and a sixth temperature higher than the fifth temperature.

Thereby, the amount of dislocations can be further reduced in the second stacked multilayer structure SL2.

Thus, a plurality of stacked structures may be formed in the embodiment. In this case, in the formation of the first film Laf in the upper stacked multilayer structure (e.g. the second stacked multilayer structure SL2), the buffer layer is the lower stacked multilayer structure (the first stacked multilayer structure SL1, specifically the first upper layer LC1). In the formation of the first film Laf in the third stacked multilayer structure SL3, the buffer layer is the second stacked multilayer structure SL2, and is specifically the second upper layer LC2, for example.

In the embodiment, for the growth of the semiconductor layers, for example, the metal-organic chemical vapor deposition (MOCVD) method, the metal-organic vapor phase epitaxy (MOVPE) method, the molecular beam epitaxy (MBE) method, the halide vapor phase epitaxy (HVPE) method, etc. may be used.

For example, in the case where the MOCVD method or the MOVPE method is used, the following may be used as the source material in the formation of the semiconductor layers. As the source material of Ga, for example, TMGa (trimethylgallium) and TEGa (triethylgallium) may be used. As the source material of $1n$, for example, TMIn (trimethylindium), TEIn (triethylindium), and the like may be used. As the source material of Al, for example, TMAl (trimethylaluminum) and the like may be used. As the source material of N, for example, $NH_3$ (ammonia), MMHy (monomethylhydrazine), DMHy (dimethylhydrazine), and the like may be used.

As the source material of the impurity, for example, the following may be used. As the source gas of Si, for example, silane ($SiH_4$) may be used. As the source material of Mg, for example, biscyclopentadienylmagnesium ($Cp_2Mg$) may be used. As the source material of Mn, for example, tricarbonylmanganese (MMT) may be used. As the source material of Fe, for example, iron carbonyl ($Fe(CO)_5$) and ferrocene ($Cp_2Fe$) may be used. As the source material of oxygen (O), for example, oxygen plasma may be used.

The embodiment provides a semiconductor device with few dislocations, a nitride semiconductor wafer with few dislocations, and a method for forming a nitride semiconductor layer with few dislocations.

In the specification, "nitride semiconductor" includes all semiconductors expressed by the chemical formula of $B_xIn_yAl_zGa_{1-x-y-z}N$ ($0 \leq x \leq 1$, $0 \leq y \leq 1$, $0 \leq z \leq 1$, $x+y+z \leq 1$) in which the composition ratios x, y, and z are changed in the respective ranges. Furthermore, in the chemical formula mentioned above, also those further containing a group V element other than N (nitrogen), those further containing various elements added in order to control various properties such as the conductivity type, and those further containing various elements unintentionally contained are included in the "nitride semiconductor."

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiment of the invention is not limited to these specific examples. For example, one skilled in the art may appropriately select specific configurations of components of nitride semiconductor wafers or semiconductor devices such as substrates, nitride semiconductor layers, stacked structures, lower layers, intermediate layers, upper layers, functional layers, n-type semiconductor layers, light emitting layers, p-type semiconductor layers, buffer layers, and electrodes from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, nitride semiconductor wafers, and nitride semiconductor layers practicable by an appropriate design modification by one skilled in the art based on the semiconductor devices, the nitride semiconductor wafers, and the nitride semiconductor layers described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor wafer comprising:
a silicon substrate having a major surface;
a buffer layer provided on the major surface of the silicon substrate that comprises at least one of AlN or AlGaN the buffer layer being undoped; and
a nitride semiconductor layer comprising a first stacked multilayer structure provided on the buffer layer on an opposite side to the silicon substrate;
wherein in the nitride semiconductor layer, the first stacked multilayer structure comprises in the following order:
a first lower layer (i) of a nitride semiconductor containing Si at a concentration ranging from $1 \times 10^{19}$ $cm^{-3}$ to less than $1 \times 10^{22}$ $cm^{-3}$ and having a thickness not less than 10 nanometers and not more than 350 nanometers, wherein said first lower layer is in direct contact with
a first intermediate layer (ii) of a nitride semiconductor containing Si at a concentration ranging from $2 \times 10^{17}$ $cm^{-3}$ to less than $1 \times 10^{19}$ $cm^{-3}$ and having a thickness not less than 200 nanometers and not more than 800 nanometers, wherein said first intermediate layer is in direct contact with
a first upper layer (iii) of a nitride semiconductor containing Si at a concentration of less than $2 \times 10^{17}$ $cm^3$ and having a thickness not less than 100 nanometers and not more than 800 nanometers;
wherein the thickness of first intermediate layer (ii) is greater than that of the first lower layer (i) and is greater than that of the first upper layer (iii); and
wherein the Si concentration in the first lower layer (i) is greater than that in the first intermediate layer (ii) which is greater than that in the first upper layer (iii).

2. The wafer according to claim 1, wherein the buffer layer comprises AlN.

3. The wafer according to claim 1, wherein the buffer layer comprises AlGaN.

4. The wafer according to claim 1, wherein the first lower layer (i) comprises a plurality of island parts comprising GaN and silicon that are discontinuous with one another that are in contact with the buffer layer.

5. The wafer according to claim 1, wherein a dislocation density in the first upper layer (iii) is lower than a dislocation density in the first lower layer (i).

6. The wafer according to claim 1, wherein at least a part of dislocations in the first intermediate layer (ii) and at least a part of dislocations in at least a part of the first upper layer (iii) are bent from a direction along a direction perpendicular to the major surface to a direction along the major surface from a lower side toward an upper side.

7. The wafer according to claim 1, wherein the first intermediate layer (ii) includes a first lower portion and a first upper portion, the first upper portion being provided between the first lower portion and the first upper layer and
a concentration of Si in the first lower portion is higher than a concentration of Si in the first upper portion.

8. The wafer according to claim 1, wherein the nitride semiconductor layer further comprises a second stacked multilayer structure that comprises:

a second lower layer (iv) of a nitride semiconductor that contains Si in direct contact with the first upper layer (iii);

a second intermediate layer (v) of a nitride semiconductor that contains Si in direct contact with second lower layer (iv), wherein the concentration of Si in layer (v) is lower than that in layer (iv) and the thickness of the second intermediate layer (v) is greater than that of second lower layer (iv); and a second upper layer (vi) that contains Si in direct contact with second intermediate layer (v), wherein the second upper layer (vi) contains a concentration of Si lower than that in the second intermediate layer (v).

* * * * *